United States Patent [19]
Ogura

[11] Patent Number: 5,635,850
[45] Date of Patent: Jun. 3, 1997

[54] INTELLIGENT TEST LINE SYSTEM

[75] Inventor: Mitsugi Ogura, Yokohama, Japan

[73] Assignee: Kabushiki Kaisha Toshiba, Kawasaki, Japan

[21] Appl. No.: 355,538

[22] Filed: Dec. 14, 1994

[30] Foreign Application Priority Data

Dec. 14, 1993 [JP] Japan .................... 5-313404

[51] Int. Cl.$^6$ .............. G06F 9/455; G01R 1/04; G01R 4/28
[52] U.S. Cl. .............. 324/760; 371/22.1; 364/490
[58] Field of Search .................. 324/760, 759, 324/764, 73.1, 158.1, 679, 765, 662; 206/328, 330; 364/522, 563; 29/827; 437/8, 217–220; 174/52.2; 361/88; 371/15.1, 16.5, 21.6, 44.4, 25.1, 28; 368/113

[56] References Cited

U.S. PATENT DOCUMENTS

| | | | |
|---|---|---|---|
| 3,344,351 | 9/1967 | Simonyan et al. | 324/754 |
| 4,875,002 | 10/1989 | Sakamoto et al. | 324/73.1 |
| 4,901,242 | 2/1990 | Kotan | 364/468 |
| 4,931,722 | 6/1990 | Stoica | 371/22.5 |
| 4,985,988 | 1/1991 | Littlebury | 29/827 |
| 5,093,982 | 3/1992 | Gussman | 29/705 |
| 5,327,075 | 7/1994 | Hashinaga et al. | 324/158.1 |
| 5,347,145 | 9/1994 | Tanaka et al. | 257/48 |
| 5,406,212 | 4/1995 | Hashinaga et al. | 324/760 |
| 5,539,652 | 7/1996 | Tegethoff | 364/490 |

FOREIGN PATENT DOCUMENTS 41 12 881  11/1991  Germany.

*Primary Examiner*—Kenneth A. Wieder
*Assistant Examiner*—Barry C. Bowser
*Attorney, Agent, or Firm*—Oblon, Spivak, McClelland, Maier & Neustadt, P.C.

[57] ABSTRACT

Process information obtained by a process section is input to a host computer. The process information includes information about a film, information about etching, information about cleaning, information about heat treatment, and information about a test. Yield information obtained by a D/S section is also input to the host computer. The host computer classifies wafers or lots into a plurality of quality ranks on the basis of these pieces of information, and supplies process conditions determined on the basis of the quality ranks to a burn-in section and a test section. The burn-in section and the test section respectively execute screening tests on the basis of the process conditions.

3 Claims, 4 Drawing Sheets

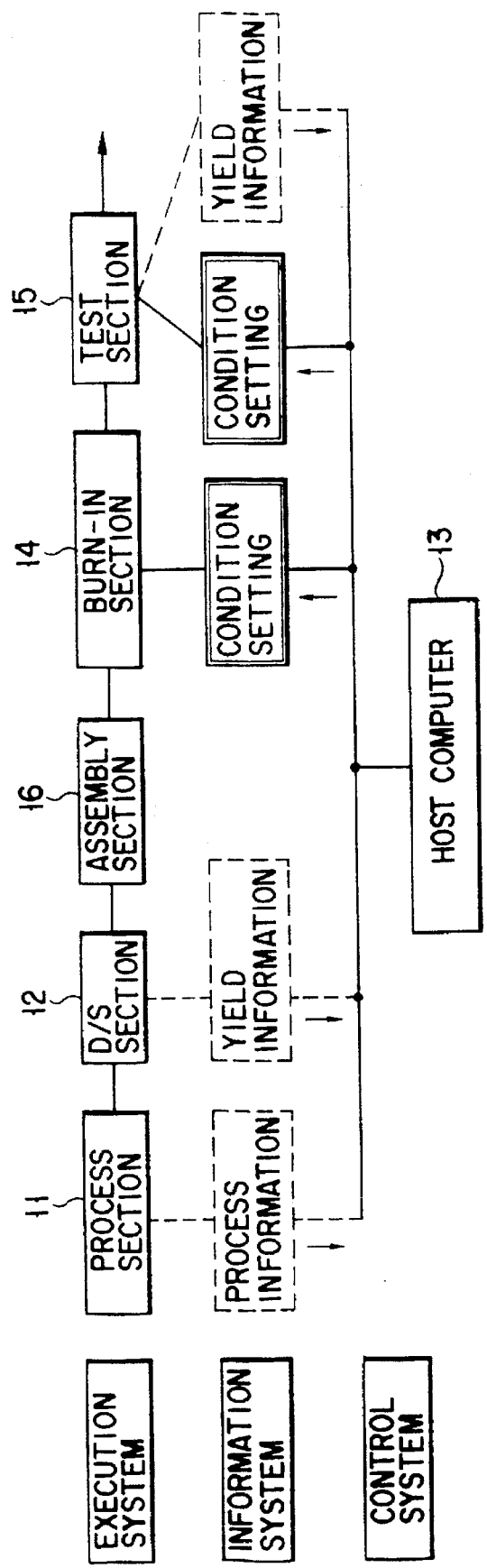
F I G. 1

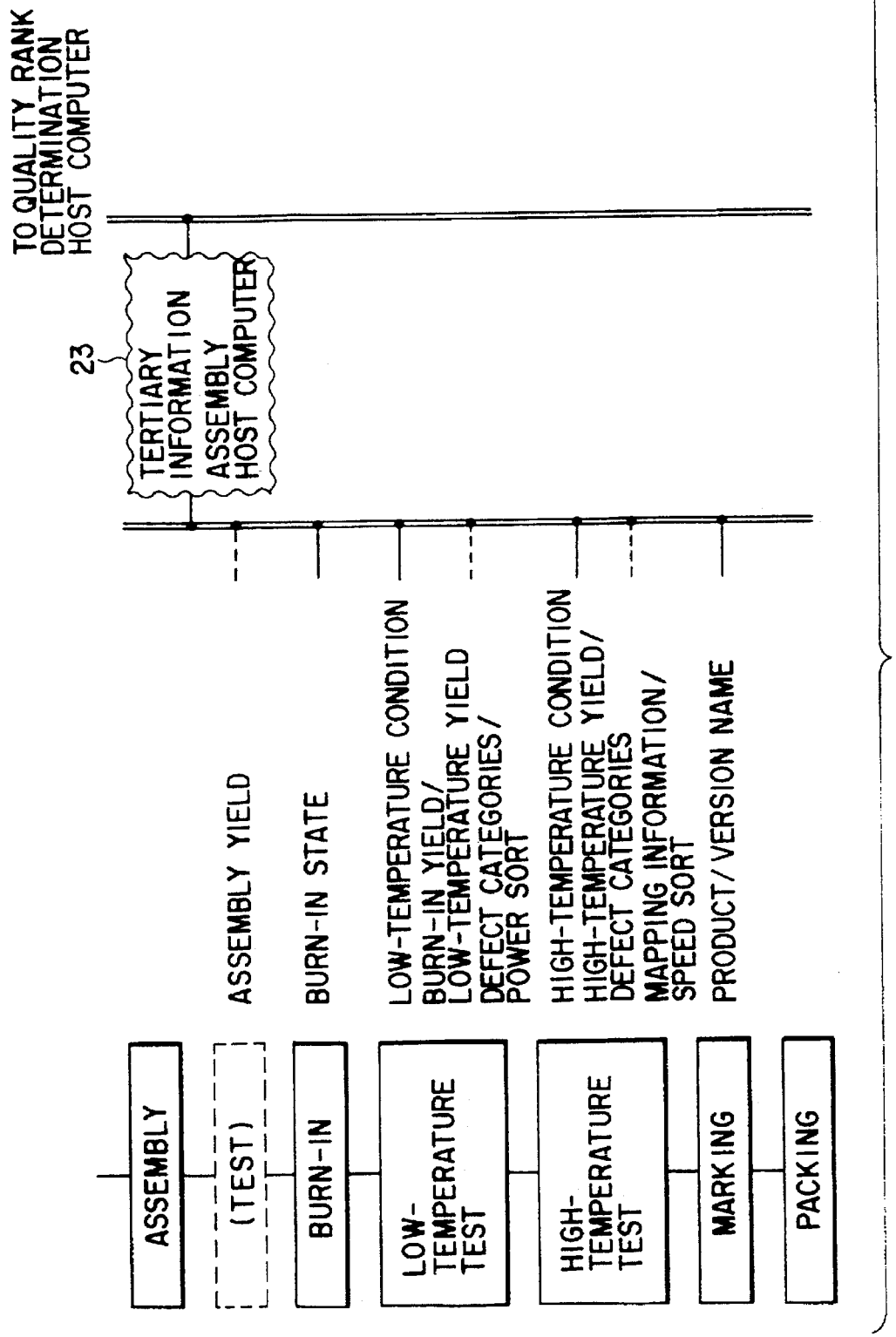
F I G. 3

INTELLIGENT TEST LINE SYSTEM

BACKGROUND OF THE INVENTION

1. Field of the Invention

The present invention relates to a system for efficiently testing ICs (integrated circuits).

2. Description of the Related Art

Conventionally, a burn-in test condition is determined from the viewpoint of ensuring the reliability of ICs for a predetermined period of time. This condition remains the same for both poor-quality ICs which are susceptible to failure and high-quality ICs which are less susceptible to failure.

In general, defective products cannot be completely removed even with a screening test such as a burn-in test. For this reason, the word "predicted failure rate" has been used.

The predicted failure rate is a ratio of defective IC chips predicted to be produced within a predetermined period of time to a plurality of IC chips on one base member (e.g., a wafer) on which a screen test has been conducted.

This predicted failure rate is determined to be a minimum constant value.

A test system including an existing burn-in test is designed such that even the failure rate of poorest-quality products do not exceed a predicted failure rate.

In a conventional test system, however, in order to improve the overall quality level of products, screening tests on all products are conducted under the same condition. Therefore, a screening test is conducted on high-quality IC chips under the same condition as that for poor-quality IC chips.

The purpose of a screening test is to remove defective products, but the test itself produces no value to be added. Therefore, the cost for a screening test must be minimized.

Currently, however, the ratio of the cost of a test step to the total cost of the manufacture of ICs has been greatly increased.

Consider, for example, a DRAM as a typical IC product. The test time increases by 10 times for each new generation (with an increase in degree of integration). That is, the test time for a 4-Mbyte DRAM is 10 times that for a 1-Mbyte DRAM. Therefore, in order to ensure the same production of 4-Mbyte DRAMs as that of 1-Mbyte DRAMs, the production facilities for 4-Mbytes DRAMs need to be 10 times as large as those for 1-Mbyte DRAMs.

In short, the screening test cost of 4-Mbyte DRAMs is 10 times or more that of 1-Mbyte DRAMs.

In practice, the memory size of a 4-Mbyte DRAM is four times that of a 1-Mbyte DRAM. It is, therefore, required that the cost of 4-Mbyte DRAMs be four times or less that of 1-Mbyte DRAMs.

Under the circumstances, rationalization must be achieved to reduce the cost of 4-Mbyte DRAMs to four times or less that of 1-Mbyte DRAMs.

According to a rationalization means currently employed, four IC chips are simultaneously tested. An improvement in efficiency achieved by this rationalization is estimated to be 1.5 times in spite of the fact that the number of products simultaneously tested is two times. Therefore, such a rationalization means is not proper.

As described above, as ICs decrease in size and increase in capacity, the ratio of the cost of a test step to the total cost for the manufacture of ICs inevitably increases. Therefore, demands have arisen for some novel rationalization for suppressing the cost of a test step.

SUMMARY OF THE INVENTION

The present invention has been made to eliminate the above drawbacks, and has as its object to reduce the test cost without increasing the test time even if ICs decrease in size and increase in capacity.

In order to achieve the above object, according to the present invention, there is provided an intelligent test line system comprising process means for processing a wafer, evaluating means for evaluating a plurality of IC chips on the wafer, control means for setting a burn-in condition and a test condition for each wafer on the basis of primary information obtained by the process means and secondary information obtained by the evaluating means, assembly means for forming an IC product from each IC chip, burn-in means for conducting a burn-in test on the IC chip on the wafer or the IC product under the burn-in condition, and test means for testing the IC chip or the IC product after the burn-in test under the test condition.

The control means sets a stress condition for each wafer on the basis of the primary information and secondary information. The control means applies a stress of a predetermined temperature and a predetermined voltage to the wafer.

The primary information includes information about formation of a film, information about etching, information about cleaning, information about heat treatment, and information about a test. The secondary information includes information about an yield, information about defect categories, information about mapping, and information about a repair yield.

The control means classifies the wafers into a plurality of quality ranks, determines tertiary information including burn-in information, low-temperature test information, and high-temperature test information on the basis of the quality ranks, and supplies the tertiary information to the burn-in means and the test means.

The control means classifies the wafers into first, second, and third quality grades on the basis of the primary information, the secondary information, and the first and second quality grades, respectively.

The control means determines the tertiary information on the basis of the third quality grade, and supplies the tertiary information to the burn-in means and the test means.

The control means classifies the wafers into a plurality of quality ranks on the basis of the primary information including information about formation of a film, information about etching, information about cleaning, information about heat treatment, and information about a test, determines test conditions on the basis of the quality ranks, and supplies the test conditions to the stress applying means.

According to the above arrangement, the control means classifies the wafers or lots into a plurality of quality ranks on the basis of the primary information obtained by the process means and the secondary information obtained by the evaluating means, and supplies a process procedure determined on the basis of the quality ranks, as tertiary information including burn-in information, low-temperature test information, and high-temperature test information, to the burn-in means and the test means.

That is, process conditions in burn-in and test steps to be subsequently performed are determined in accordance with the quality ranks of wafers or lots.

The test time, therefore, can be greatly decreased as compared with a case wherein burn-in and test steps are executed under the same conditions regardless of the quality of wafers or lots. In addition, such a decrease in test time can suppress increases in cost and the size of manufacturing facilities accompanying an increase in the scale of ICs.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1 is a block diagram showing a system of the present invention;

FIG. 3 is a view showing the system in FIG. 1 in detail; and

DETAILED DESCRIPTION OF THE PREFERRED EMBODIMENT

Figure 2:
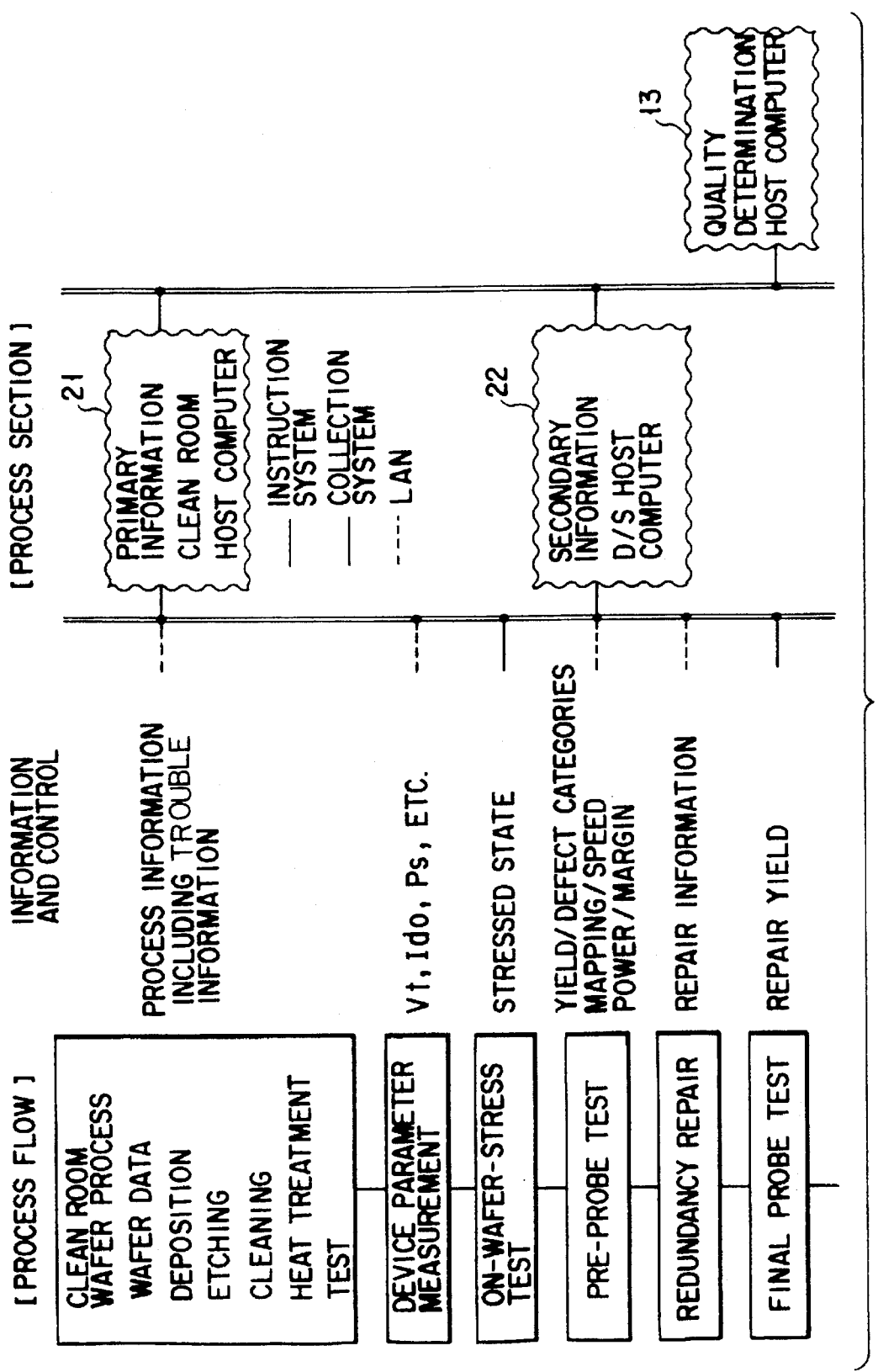
FIG. 2 is a view showing the system in FIG. 1 in detail.

An intelligent test line system of the present invention will be described in detail below with reference to the accompanying drawings.

FIG. 1 shows the intelligent test line system of the present invention.

In this system, various information obtained by a process section 11 and a D/S section 12 is processed by a host computer 13 to add a quality rank to a wafer or a wafer lot, and a test condition in a burn-in section 14 and a test section 15 is determined on the basis of the quality rank.

Process information (including trouble information) is obtained by the process section 11 and input to the host computer 13. Yield information is obtained by the D/S section 12 and input to the host computer 13. The host computer 13 adds a rank to a product (a wafer or a wafer lot) on the basis of the process information and the yield information.

The host computer 13 determines a test condition in the burn-in section 14 and the test section 15 in accordance with the rank of the product, and transfers the test condition to the burn-in section 14 and the test section 15. This test condition changes with a change in the rank of a product.

The burn-in section 14 and the test section 15 test the product under the test condition corresponding to the product to be tested.

As described above, in the system of the present invention, a quality rank is determined for each product (waver or wafer lot), and the test condition for each product is changed in accordance with the quality rank.

A strict test condition is set for a poor-quality wafer, whereas a moderate test condition is set for a high-quality wafer, thereby shortening the test time as compared with the conventional system in which a test condition remains the same.

FIGS. 2 and 3 show the detailed arrangement of the system of the present invention.

Information for determining the condition of a screening test such as a burn-in test is constituted by primary information about an IC manufacturing process in a clean room and secondary information about a yield. The primary information is input to the host computer 13 via a clean room host computer 21. The secondary information is input to the host computer 13 via a D/S host computer 22.

There are two quality ranks added to products, i.e., a rank based on the primary information and a rank based on the secondary information.

The primary information is information about the performance of the clean room. This information is a factor dominating the basic characteristics of a wafer lot. Therefore, it is considered that the distribution of quality ranks based on the primary information almost coincides with a normal distribution.

In this embodiment, first of all, products (e.g., lots) are classified into the following four quality grades on the basis of the primary information:

[Quality Grades]

A rank: lots located within $2\sigma$ from the process specification center

B rank: lots located at 2 to $3\sigma$ of the process specifications

C rank: lots located outside $3\sigma$ from the process specification center

D rank: lots having undergone an abnormal state or an error in the process and hence requiring special attention In this embodiment, for example, stress conditions of on-wafer-stress tests are preferably classified into two groups in accordance with the above four quality grades for the following reason.

A stress condition similar to that in the conventional system is set for A and B ranks regarded as relatively high ranks, whereas a strict stress condition is set for C and D ranks regarded as low ranks, thereby degrading defective products in the early stage and removing them in a D/S step as the next step. This processing is advantageous in terms of economical efficiency and quality assurance.

The secondary information is information about a D/S step of determining the quality of each chip in a wafer having undergone a process. This information is regarded as a factor for monitoring the initial quality of a lot and is used to verify the quality rank of a lot which is classified on the basis of the primary information. As this information, yield information is generally used.

In this embodiment, products (e.g., lots) are classified into the following three quality grades on the basis of the secondary information:

[Quality Grades]

H rank: high-quality lots exhibiting yields exceeding the average value

M rank: lots within $2\sigma$ from the central value

L rank: lots located outside the normal distribution of yields

Table 1 shows the quality grades of lots in the form of a matrix by combining the ranks of the products based on the primary information and the ranks of the products based on the secondary information.

TABLE 1

| Quality Grade Based On Secondary information | Quality Grade Based on Primary information | | | |
|---|---|---|---|---|
| | A | B | C | D |
| H | G | G | N | W |
| M | G | N | W | A |
| L | N | W | A | A |

In this embodiment, products (e.g., lots) are classified into the following four quality grades:

[Quality Grades]

Figure 4:
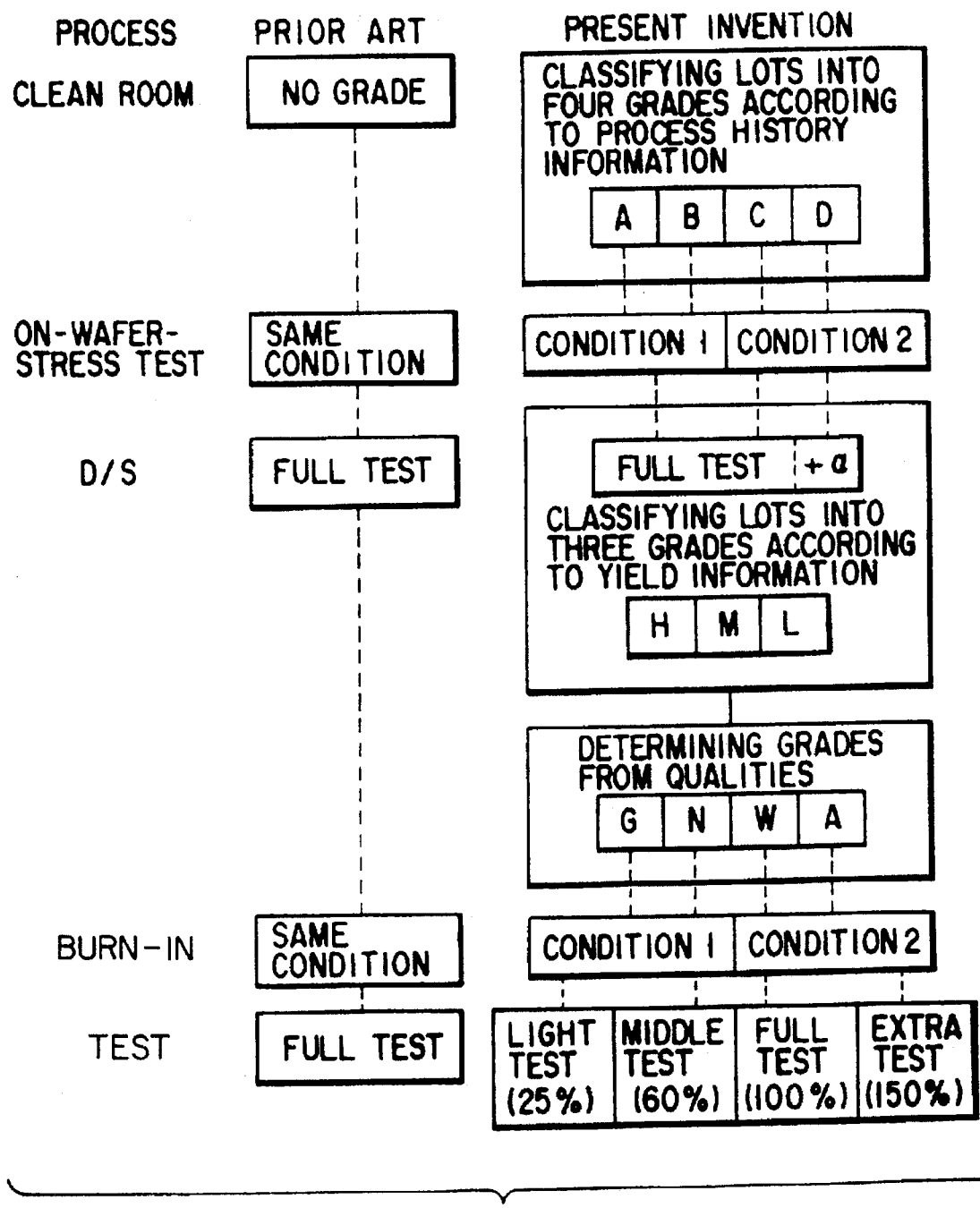
FIG. 4 is a view showing comparison between a conventional system and the system of the present invention.

G (Great) rank: lots having good quality, on which a screening test such as a burn-in test is performed under a moderate condition N (Normal) rank: lots having average quality, on which a screening test such as a burn-in test is performed under an intermediate condition W (Warning) rank: lots having quality poorer than average quality, on which a screening test such as a burn-in test is performed under the same condition as that in the conventional system A (Abnormal) rank: lots having poor quality, on which a screening test such as a burn-in test is performed under a condition stricter than that in the conventional system FIG. 4 shows comparison between the conventional system and the system of the present invention.

In this system, an on-wafer-stress test on, e.g., products (e.g., wafers) of A and B ranks is performed under condition 1, whereas the same test on products of C and D ranks is performed under condition 2.

A "plus something (+°)" test (full test) is additionally conducted on products of quality rank D based on the primary information in a D/S step. Products determined as defective products by the full test in the D/S step are removed.

A burn-in test is conducted on products of G and N ranks under condition 1, and the same test is conducted on products of W and A ranks under condition 2.

In this system, with deletion and addition of test items, the total test time in a test step is set to be 25% of that in the conventional system with respect to G rank; 60% with respect to N rank; 100% with respect to W rank; and 150% with respect to A rank.

This test time is variously changed depending on the type of product and the degree of difficulty of a manufacturing process. The test time is also changed depending on the degree of manufacturing skill. In this embodiment, two conditions are set as burn-in conditions. However, three or more conditions, e.g., a condition for each grade, may be set.

Final test results are statistically processed by the host computer. That is, the burn-in conditions and the test conditions are always reexamined on the basis of quality ranks or test conditions and the actual quality of products.

Table 2 shows the ratios of lots (of DRAMs in this case) classified on the basis of the primary information and the secondary information.

TABLE 2

| | A 50% | B 30% | C 15% | D 5% |
|---|---|---|---|---|
| H 50% | G 25% | G 15% | N 7% | W 3% |
| M 35% | G 17% | N 10% | W 5% | A 2% |
| L 15% | N 8% | w 5% | A 2% | A 1% |

In this case, in the first grade, the lots of A rank were 50%; the lots of B ranks, 30%; the lots of C rank, 15%; and the lots of D rank, 5%. In the second grade, the lots of H rank were 50%; the lots of M rank, 35%; and the lots of L rank, 15%.

In this case, with regards to the quality ranks of the lots based on the combination of the primary information and the secondary information in the form of a matrix, the lots of G rank are 57%; the lots of N rank, 25%; the lots of W rank, 13%; and the lots of A rank, 5%.

Test times in the present invention are calculated with the test time in the conventional system being considered to be "1".

The test time for the lots of G rank is ¼ that in the conventional system (0.25); the test time for the lots of N rank, ⅗ (0.6); the test time for the lots of W rank, the same as that in the conventional system (1); and the test time for the lots of A rank, 1.5 times (1.5). In this case, a total test time t is given by $$t=0.57\times0.25+0.25\times0.6+0.13\times1.0+0.05\times1.5=0.4975\approx0.5 \quad (1)$$

As has been described above, according to the intelligent test line system of the present invention, the following effects can be obtained.

According to the present invention, the test time for products can be greatly reduced. According to the trial calculation under the present conditions, the test time is about 50% of the test time in the conventional system, as indicated by equation (1), which corresponds to an efficient improvement of 200%. That is, with test facilities of the same size, products twice as many as those in the conventional system can be tested, and the production twice that in the conventional system can be ensured. In addition, since the test cost is proportional to the test time, the test cost for products can be reduced, resulting in a great contribution to an increase in profit.

Assume that this intelligent test line system is introduced into a new plant to be constructed. In this case, if the test time is the same as that in the conventional system, the facilities for tests and burn-in tests can be reduced by several 10%. The facility investment can be reduced accordingly, and hence the cost can be reduced. In addition, since the facilities can be reduced in size, the space for the test facilities in the plan can also be reduced, resulting in a reduction in construction cost.

In addition, the operation cost (expenses for air condition and electric power and the like) for test and burn-in steps can be reduced accordingly. Furthermore, since the introduced facilities need not be large, labor saving can be achieved. Therefore, a reduction in personal expenses can be realized. Moreover, additional screening tests may be conducted on lots posing problems in terms of quality, thus conducting strict, accurate tests. With these tests, an improvement in quality can be achieved.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An intelligent test line system comprising:

means for processing a semiconductor wafer;

first classifying means for classifying the semiconductor wafer on the basis of information obtained by said processing means into a first quality rank;

means for determining a stress rank of the semiconductor circuits of the semiconductor wafer in accordance with said first quality rank;

means for applying to the semiconductor circuits of the semiconductor wafer a stress test based upon said determined stress rank;

means for evaluating a plurality of semiconductor circuits on the semiconductor wafer; and second classifying means for classifying the semiconductor circuits on the basis of information obtained by said evaluating means into a second quality rank.

2. An intelligent test line system according to claim 1, wherein said stress test includes items of temperature and voltage.

3. An intelligent test line system according to claim 1, further comprising:

third classifying means for classifying the semiconductor circuits into a third quality rank based upon said first and second quality ranks; and means for performing burn-in and full testing of the integrated circuits based upon said third quality rank.

* * * * *